(12) United States Patent
Lai et al.

(10) Patent No.: US 7,038,288 B2
(45) Date of Patent: May 2, 2006

(54) FRONT SIDE ILLUMINATED PHOTODIODE WITH BACKSIDE BUMP

(75) Inventors: Jay Jie Lai, Cerritos, CA (US); Truc Q. Vu, Tustin, CA (US); Gary B. Warren, Huntington Beach, CA (US)

(73) Assignee: Microsemi Corporation, Irvine, CA (US)

( * ) Notice: Subject to any disclaimer, the term of this patent is extended or adjusted under 35 U.S.C. 154(b) by 3 days.

(21) Appl. No.: 10/669,081

(22) Filed: Sep. 23, 2003

(65) Prior Publication Data

US 2004/0129991 A1 Jul. 8, 2004

Related U.S. Application Data

(60) Provisional application No. 60/413,427, filed on Sep. 25, 2002.

(51) Int. Cl.
*H01L 31/00* (2006.01)

(52) U.S. Cl. .................. 257/448; 257/443; 257/434; 257/457; 257/459; 250/239; 250/370.14; 438/29

(58) Field of Classification Search ................ 257/184, 257/433, 434, 448, 457, 459; 250/239, 370.14; 438/29
See application file for complete search history.

(56) References Cited

U.S. PATENT DOCUMENTS

| | | | |
|---|---|---|---|
| 4,491,983 A * | 1/1985 | Pinnow et al. ................ 398/67 |
| 5,049,521 A | 9/1991 | Belanger et al. ............. 438/295 |
| 5,973,337 A * | 10/1999 | Knapp et al. ................ 257/99 |
| 6,143,588 A * | 11/2000 | Glenn ........................ 438/116 |
| 6,348,682 B1 * | 2/2002 | Lee ........................ 250/214 A |
| 6,483,101 B1 * | 11/2002 | Webster ..................... 250/216 |
| 6,521,476 B1 * | 2/2003 | Kubota ....................... 438/39 |
| 6,586,721 B1 * | 7/2003 | Estevez-Garcia ........... 250/221 |
| 6,614,103 B1 * | 9/2003 | Durocher et al. ........... 257/678 |
| 6,633,421 B1 * | 10/2003 | Trezza ......................... 438/24 |
| 6,686,580 B1 * | 2/2004 | Glenn et al. ............. 250/208.1 |
| 6,703,689 B1 * | 3/2004 | Wada ........................ 257/621 |
| 6,737,720 B1 * | 5/2004 | Ho et al. .................... 257/433 |
| 2003/0089958 A1* | 5/2003 | Gutierrez-Aitken et al. 257/458 |
| 2005/0051859 A1* | 3/2005 | Hoffman ..................... 257/434 |

FOREIGN PATENT DOCUMENTS

JP 63066964 A * 3/1988

\* cited by examiner

*Primary Examiner*—Allan R. Wilson
(74) *Attorney, Agent, or Firm*—Knobbe, Martens, Olson & Bear, LLP

(57) ABSTRACT

This invention relates to a novel optoelectronic chip with one or more optoelectronic devices, such as photodiodes, fabricated on a front side of a semiconductor wafer and contacts on a backside of the semiconductor wafer. The backside contacts can be contact bumps, which allow the optoelectronic chip to achieve the benefits of flip chip packaging without flipping the optoelectronic chip upside down with respect to a chip carrier. In an optical communication system, a photodiode chip can be backside bumped to a chip carrier or an electronic chip, allowing front side illumination of the photodiode chip. Front side illumination offers many benefits, including improved fiber alignment, reduced manufacturing time, and overall cost reduction.

25 Claims, 9 Drawing Sheets

FRONT SIDE ILLUMINATED PHOTODIODE WITH BACKSIDE BUMP

RELATED APPLICATION

This application claims the benefit of priority under 35 U.S.C. § 119(e) of U.S. Provisional Application No. 60/413,427 entitled "Frontside Illuminated Photodiode With Backside Bump," filed on Sep. 25, 2002, the entirety of which is incorporated herein by reference.

BACKGROUND OF THE INVENTION

1. Field of the Invention

The present invention relates to semiconductor devices and, in particular, refers to an optoelectronic device.

2. Description of the Related Art

Photodiodes are used in optical communication networks to convert optical signals to electrical signals for processing using electronic circuits. In high bandwidth applications, the photodiodes can often be packaged using flip chip interconnections. The flip chip interconnections provide many benefits, including smaller package size, elimination of bond wires, and improved signal integrity.

FIG. 1 illustrates a typical flip chip package for a backside-illuminated photodiode. A photodiode chip is placed face down on a chip carrier 100. Solder bumps 102 couple respective contacts 104 on the front side 106 of the photodiode chip to corresponding contacts 108 on the chip carrier 100. The contacts 104 on the front side 106 of the photodiode chip are electrically coupled to a photodiode device 110 formed on the front side 106 of the photodiode chip. In the particular application illustrated in FIG. 1, light signals 112 from a fiber optic cable (not shown) are incident on a backside 114 of the photodiode chip and travel through a chip substrate 116 before reaching the photodiode device 110 on the front side 106 of the photodiode chip.

The design of a backside illuminated photodiode is complex, and its performance is usually inferior to a front side illuminated photodiode. For example, the thickness of the chip substrate 116 may range from 100 micrometer (µm) to 20 µm. Light exiting from the fiber optic cable may diverge causing the light spot to get bigger when it reaches an active detecting area of the photodiode device 110 on the front side 106 of the photodiode chip. A photodiode with a wider aperture may be required to capture all of the light, which will increase the device capacitance and degrade the speed of the device. The divergence of the light beams may also require an additional lens on the backside 114 to re-focus the light signal 112.

In addition, the fiber optic cable coming to the backside 114 usually needs active alignment, which properly positions the fiber optic cable with respect to the photodiode device 110 based on signal performance. The normal method of attaching the fiber optic cable with minimal back-reflection is to cut the fiber optic cable at some small angle so that reflected light does not couple back to the fiber optic cable. An angled light signal coupled with a thick chip substrate requires active alignment of fiber to the photodiode since the alignment tolerance is very small. Active alignment is time consuming and an expensive assembly technique.

Furthermore, testing a backside-illuminated photodiode is not as easy as testing a front illuminated photodiode. Responsivity, linearity, and speed tests are difficult to perform when the photodiode is in wafer form since probe pads are on the front side 106 of the chip while the light signal 112 has to come in from the backside 114. Sampling tests are done after the chip is mounted in a flip chip package, which adds cost and long cycle time to the testing of the backside illuminated photodiode. Finally, backside illuminated photodiodes are not feasible using absorptive chip substrates, such as, for example, silicon (Si), germanium (Ge) or gallium arsenide (GaAs) semiconductors.

FIG. 2 illustrates another flip chip package which allows for front side illumination of the photodiode device 110. FIG. 2 is substantially similar to FIG. 1, except a hole is cut through the chip carrier 100 to allow light to illuminate directly on the photodiode device 110 formed on the front side 106 of the photodiode chip. Although the flip chip package shown in FIG. 2 alleviates some of the problems associated with backside illumination, the hole through the chip carrier 100 imposes more difficulties in the packaging of the photodiode and is not conducive to chip-on-chip packages.

SUMMARY OF THE INVENTION

Certain embodiments of the invention solves these and other problems by providing a novel optoelectronic chip with one or more optoelectronic devices fabricated (or formed) on a front side of a semiconductor wafer and contacts on a backside of the semiconductor wafer. For example, one or an array of photo detectors or photo emitters are formed on the front side (or front surface) of a chip with corresponding electrical contacts on the backside (or back surface) of the chip. In one embodiment, the backside contacts are electrically coupled to the respective optoelectronic devices on the front side by respective vias through the semiconductor wafer (or substrate).

The backside contacts can be contact bumps, which allow the optoelectronic chip (or die) to achieve the benefits of flip chip packaging without flipping the optoelectronic chip upside down with respect to a chip carrier (or a package substrate). For example, the novel optoelectronic chip is placed face up on top of a chip carrier or a circuit board and bumped to the chip carrier or to the circuit board using the backside contacts to assemble a chip package. The backside of the optoelectronic chip can also be bumped to an electronic chip to form a chip-on-chip module (or a chip-on-chip stack). Solder bumps or conductive bonding electrically and mechanically couple the contacts on the backside of the optoelectronic chip to the chip carrier, the circuit board or the electronic chip.

In one embodiment, the optoelectronic chip is used in a communication network to interface an optical system (e.g., a fiber optic cable) with an electrical system (e.g., electronic signal processor). The optoelectronic chip with backside contacts can advantageously have the front side of the optoelectronic chip proximal to the optical system while the backside contacts electrically couple the optoelectronic devices to the electrical system. The optoelectronic devices on the front side of the optoelectronic chip have apertures for communicating with the optical system.

Placing the aperture of the optoelectronic device proximate or with a direct signal path to the optical system has many benefits. For example, the proximity of the aperture to an optical interface reduces the area of the aperture, thereby reducing parasitic capacitance and improving speed of the optoelectronic device. The proximity of the aperture to the optical interface facilitates passive (e.g., mechanical or visual) alignment of the optoelectronic device to the optical interface, thereby reducing assembly time and cost. With the direct signal path, light signals do not have to travel through the chip substrate, which reduces manufacturing time and cost by facilitating full testing of the optoelectronic device prior to packaging or during wafer processing. Furthermore, the direct signal path allows more semiconductor materials (e.g., Si, Ge or GaAs) to be used for realizing an optoelectronic chip capable of providing benefits typically found in flip chip technology.

In one embodiment, a photodiode is formed on a front side of a semiconductor chip to sense light signals and to produce corresponding electrical signals. The semiconductor chip includes contacts on a backside. A first contact is electrically coupled to an anode of the photodiode by a first via hole (or via) through a substrate of the semiconductor chip. A second contact is electrically coupled to a cathode of the photodiode by a second via through the substrate of the semiconductor chip. The photodiode can be fabricated using any semiconductor material, such as, for example, Si, Ge, GaAs, or indium phosphide (InP). The photodiode can be realized with different physical structures. For example, the photodiode can be a P-I-N (or PIN) photodiode, an avalanche photodiode (APD), or a metal-semiconductor-metal (MSM) Schottky photodiode.

In one embodiment, the photodiode with backside contacts (or backside bumps) is part of a high speed or a high bandwidth optical receiver and is used in an optical communication system to interface a fiber optic cable with an electronic receiver circuit. For example, the front side of the semiconductor chip is placed next to (or proximal) to an output of the fiber optic cable for receiving a light signal (or front side illumination). The backside of the semiconductor chip is proximal to an input of the electronic receiver circuit for providing the corresponding electrical signal to the input of the electronic receiver circuit.

In one embodiment, the photodiode is mounted in a package by bumping the backside contacts to a chip carrier (or package substrate) first. For example, the backside contacts are electrically coupled to corresponding contacts on the chip carrier using solder bumps, and the chip carrier may have other connections for coupling the electrical signal to the electronic receiver circuit. In another embodiment, the backside contacts of the photodiode chip are bumped to corresponding contacts on an electronic chip to form a chip-on-chip stack or module with front side illumination. For example, the anode and the cathode of the photodiode chip can be directly coupled to inputs of a transimpedance amplifier chip.

There are many other uses for a front side illuminated photodiode with backside bump, such as, for example, bar code scanners or remote control receivers. However, the discussion is focused on the optical communication system because high speed networks, such as 2.5 Gigabits/second (Gbs) or 10 Gbs optical networks, benefit from the front side illuminated photodiode with backside bump. For example, the front side illuminated photodiode with backside bump provides better performance, lowers the cost of testing and assembly (e.g., using passive fiber alignment rather than active fiber alignment), and can be implemented in any semiconductor material systems.

In one embodiment, a method for fabricating a photodiode with backside contacts includes forming the photodiode device on a front side of a semi-insulated semiconductor. First contacts are also formed on the front side and are respectively coupled to a cathode and an anode of the photodiode. Electrically conductive via holes through the semi-insulated substrate are formed. Second contacts are formed on a backside of the semi-insulated substrate and are electrically coupled to the first contacts by the respective via holes.

In one embodiment, the photodiode is a PIN photodiode and is formed by growing epitaxially N+, intrinsic, and P+ layers on the front side of the semi-insulated substrate. One or more masks are applied to form a desired structure (or size) with desired interconnections for the PIN photodiode. In one embodiment, the PIN photodiode is realized using InP, and an epitaxial layer of InGaAs is grown on top of a P+ layer to facilitate a better ohmic metal contact to the P+ layer. Silicon nitride may be deposited on exposed surfaces to reduce light reflection.

Laser diodes or light emitting devices produce a light signal based on an electrical signal. Front side illuminated laser diodes with backside bump has many of the same advantages as front side illuminated photodiodes with backside bump. For example, a laser diode is formed on a front side of a chip substrate with contacts on a backside. The contacts are electrically coupled to the laser diode by conductive via holes through the chip substrate. In one embodiment, the laser diode is a distributed-feedback (DFB) laser. In another embodiment, the laser diode is a vertical cavity surface emitting laser (VCSEL).

For purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF THE INVENTION

Figure 1:
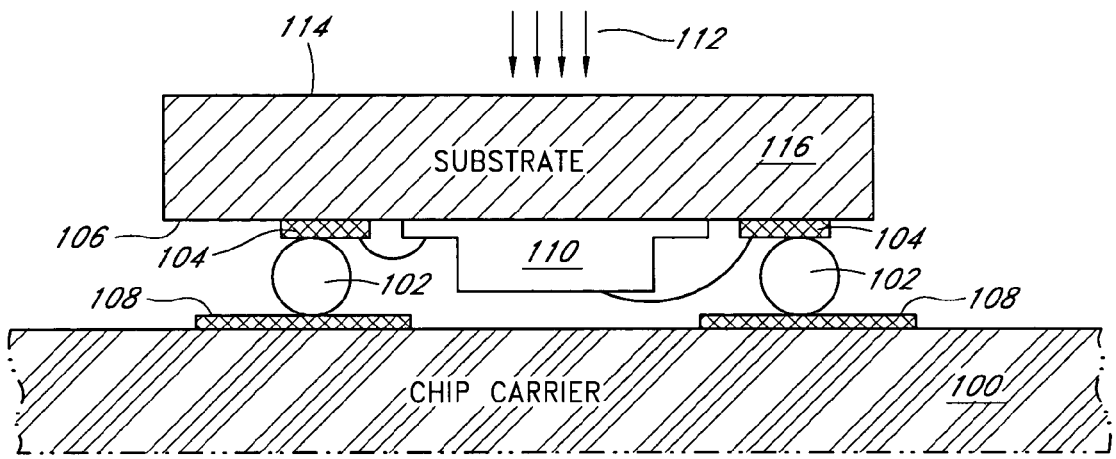
FIG. 1 is a simplified cross-sectional view of a typical flip chip package for a backside-illuminated photodiode.
Figure 2:
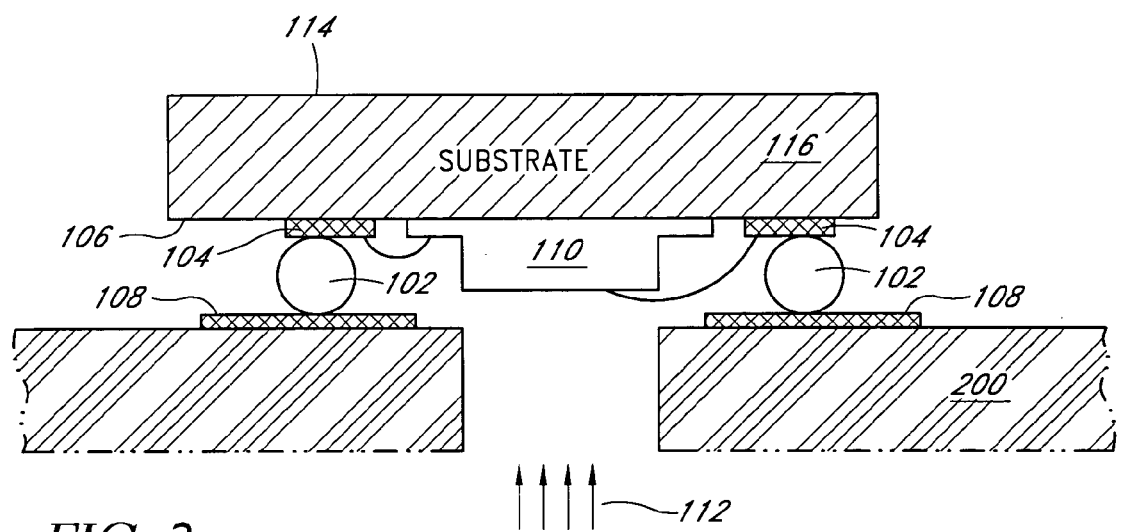
FIG. 2 is a simplified cross-sectional view of a flip chip package which allows for front side illumination of a photodiode.

In the following detailed description of the invention, reference is made to the accompanying drawings which form a part thereof, and in which is shown, by way of illustration, specific embodiments in which the invention may be practiced. In the drawings, like numerals describe similar components throughout the several views.

In the following description, the terms wafer and substrate are interchangeably used to refer generally to any structure on which integrated circuits (ICs) are formed, and also to such structures during various stages of integrated circuit fabrication. Both wafer and substrate include doped and undoped semiconductors, epitaxial semiconductor layers supported by a base semiconductor or insulator, combinations of such layers, as well as other semiconductor structures well known to one skilled in the art, including bulk semiconductor and semiconductor-on-insulator (SOI) substrates. The term conductor is understood to include semiconductors, and the term insulator is defined to include any material that is less electrically conductive than the materials referred to as conductors.

Figure 3:
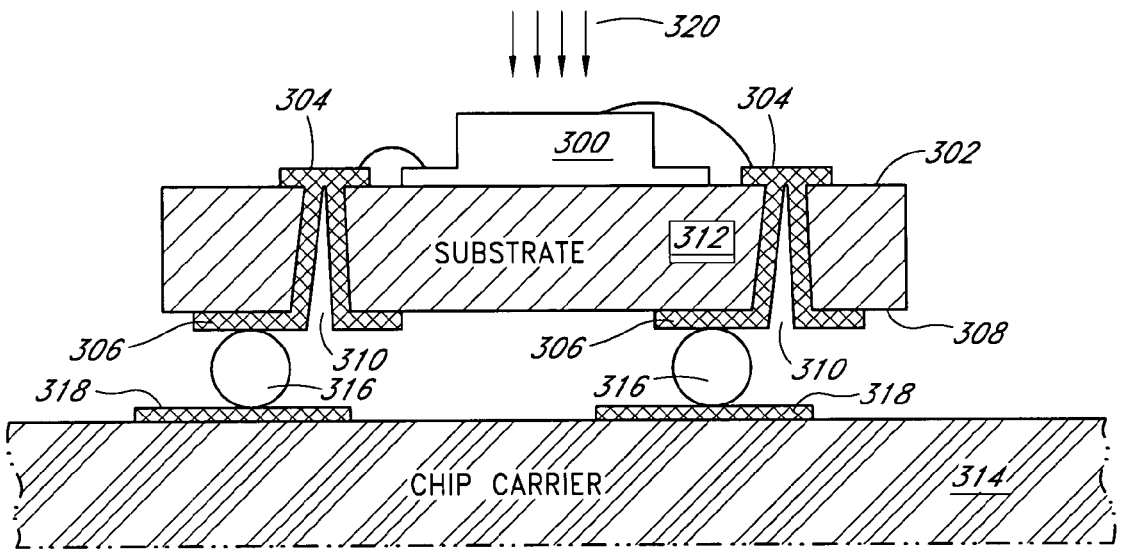
FIG. 3 is a simplified cross-sectional view of an optoelectronic chip with backside contacts in accordance with one embodiment of the invention.

FIG. 3 is a simplified cross-sectional view of an optoelectronic chip with backside contacts in accordance with one embodiment of the invention. For example, an optoelectronic device 300 is formed on a front side 302 of a wafer. Front side contacts 304 are also formed on the front side 302 and are electrically coupled to electrical terminals of the optoelectronic device 300. Backside contacts 306 are formed on a backside 308 of the wafer and are electrically coupled to the corresponding front side contacts 304 by respective vias 310 through a semi-insulating substrate 312. In other embodiments, a variety of conducting paths (e.g., wrap-around conductors) can be used to electrically couple the front side contacts 304 to the backside contacts 306.

As discussed above, the backside contacts 306 advantageously allow the optoelectronic chip to be bumped to a chip carrier 314 faced up. For example, the optoelectronic chip (or die) is mounted in a package by coupling the backside contacts 306 of the optoelectronic chip to the chip carrier 314 with solder bumps 316. In other embodiments, a variety of connecting structures can be used to couple the backside contacts 306 to the chip carrier 314. The optoelectronic device 300 on the front side 302 remains exposed, and an aperture corresponding to the optical interface of the optoelectronic device 300 can be placed proximate to an optical medium for enhanced (or direct) transmission or reception of light signals 320 after packaging.

Figure 4:
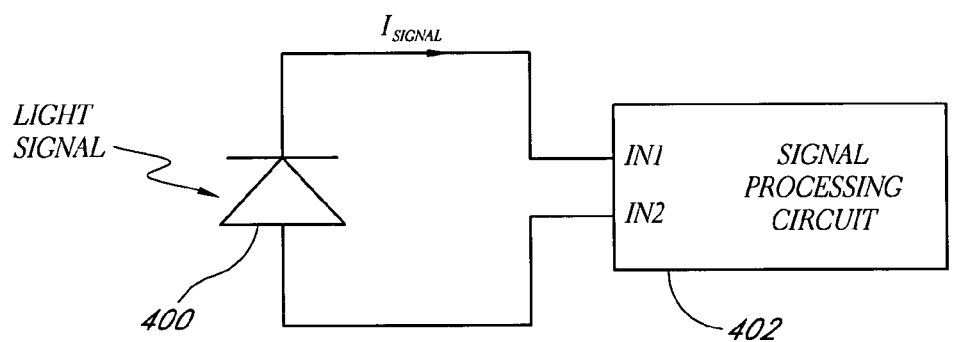
FIG. 4 is a block diagram of one embodiment of a photo receiver circuit.

FIG. 4 is a block diagram of one embodiment of a photo receiver circuit. The photo receiver circuit uses a photodiode 400 to receive a light signal and to translate the light signal into an electrical current signal ($I_{SIGNAL}$). The electrical terminals of the photodiode 400 are coupled to input terminals of a signal processing circuit 402, which can perform further processing on the electrical current signal. For example, the photodiode 400 has a cathode coupled to a first input terminal (IN1) and an anode coupled to a second input terminal (IN2) of the signal processing circuit 402.

The signal processing circuit 402 can perform a variety of functions (e.g., biasing, amplification or filtering). In one embodiment, the photo receiver circuit is used in an optical communication system for high speed or high bandwidth applications. The signal processing circuit 402 can be a transimpedance amplifier, which transforms the electrical current signal into an equivalent electrical voltage signal to facilitate subsequent processing.

In one embodiment, a photodiode chip is first mounted on a chip carrier as described in FIG. 3 before connecting to an electronic chip containing the signal processing circuit or the transimpedance amplifier. In high speed applications, it may be desired to bypass the chip carrier and to connect the photodiode chip directly to the electronic chip, thereby improving performance (e.g., by reducing parasitic inductance associated with other types of packaging methods) and thereby reducing the size of the photo receiver circuit.

Figure 5:
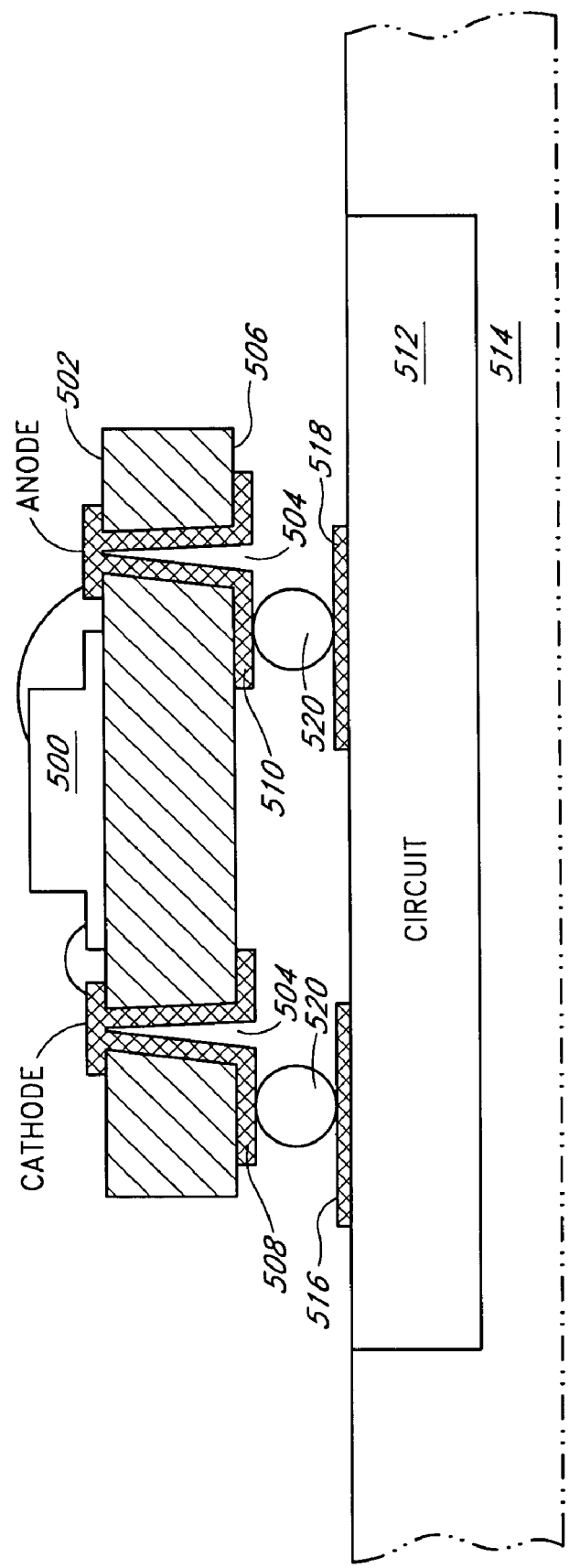
FIG. 5 illustrates one embodiment of forming a chip-on-chip module for a photodiode with backside bumps.

FIG. 5 illustrates one embodiment of forming a chip-on-chip module for a photodiode chip with backside bumps. A photodiode device 500 is fabricated on a top surface (or front side or front surface) 502 of a photodiode chip (or die). Vias 504 are formed through a substrate of the photodiode die to electrically couple the photodiode device 500 to contacts formed on a bottom surface (or backside or back surface) 506 of the photodiode die. For example, a first backside contact 508 is coupled to a cathode of the photodiode device 500, and a second backside contact 510 is coupled to an anode of the photodiode device 500.

In one embodiment, the backside contacts 508, 510 are bumped to an electronic chip to form a chip-on-chip stack (or module). The electronic chip can include an active circuit area 512 in a chip substrate 514. Contacts electrically coupled to terminals of the electronic chip are formed on a surface of the electronic chip to bump to the photodiode chip. For example, a contact 516 coupled to a first input terminal of a transimpedance amplifier is bumped to the first backside contact 508, and a contact 518 coupled to a second input terminal of the transimpedance amplifier is bumped to the second backside contact 510. Solder bumps (or other types of electrically conductive bonding) 520 can be used to mechanically as well as electrically couple the photodiode chip to the transimpedance amplifier chip. For convenience, the backside contacts 508, 510 can be located any where on the backside of the photodiode chip. For example, the backside contacts 508, 510 can be placed closer to each other, further from each other, or accordingly to locations of the input terminals of the transimpedance amplifier.

As discussed above, the photodiode chip with backside contacts 508, 510 (or backside bumps) advantageously allows an optical aperture for sensing light signals in the photodiode to be placed close to a light source. For example, the light signals are configured to be incident on the front side 502 of the photodiode die after assembly into the chip-on-chip module. In other words, the photodiode chip with backside bumps can realize the benefits of front side illumination (e.g., passive alignment, smaller devices, performance testing at the wafer level, wider range of semiconductor materials). The light signals do not have to travel through a die substrate to reach the optical aperture of the photodiode device.

The photodiode (e.g., a PIN photodiode, an APD, a MSM Schottky photodiode) can be fabricated using any semiconductor material (e.g., Si, Ge, GaAs, InP). Although not shown, an array of photodiodes with backside contacts can be similarly formed on a chip which is then bumped to a chip carrier or an electronic chip. In one embodiment, the number of backside contacts can be reduced by commonly connecting cathodes or anodes in the array of photodiodes.

Figure 6:
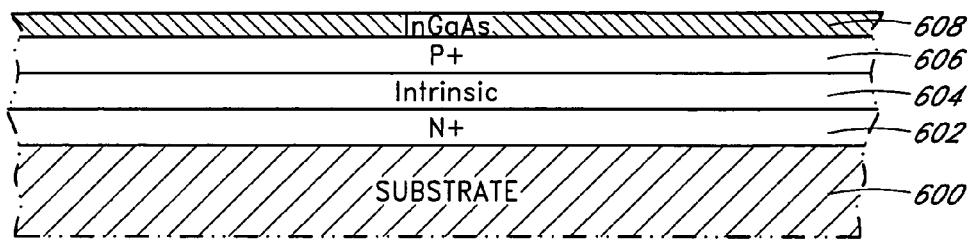
FIGS. 6–13 illustrate one method of fabricating a photodiode with backside contacts.

FIGS. 6–13 illustrate one method of fabricating a photodiode chip with backside contacts. In particular, FIG. 6 illustrates a wafer after formation of one or more epitaxial layers on a front side of the wafer. In the illustrated embodiment, four epitaxial layers are formed on top of one another for fabricating a vertical PIN photodiode device on the front side. The invention is not restricted to vertical PIN photodiode devices. Accordingly, the following discussion should be appreciated as being for illustrative purposes and wide variety of optoelectronic devices (e.g., horizontal PIN photodiodes) to be formed on the wafer will result in suitable modifications of this and subsequent processing steps.

In the embodiment of FIG. 6, an N+ layer 602 is formed by epitaxial growth on top of a semi-insulated substrate 600. An intrinsic layer 604 is formed by epitaxial growth on top of the N+ layer 602. A P+ layer 606 is formed by epitaxial growth on top of the intrinsic layer 604. In one embodiment, the N+ layer 602 and the P+ layer 606 are fabricated from InP. The intrinsic layer 604, which is sandwiched between the N+ layer 602 and the P+ layer 606, is fabricated from InGaAs. In addition, an InGaAs layer 608 is formed by epitaxial growth on top of the P+ layer 606 to facilitate a better ohmic contact to the P+ layer 606 in a subsequent processing step.

Figure 7A:
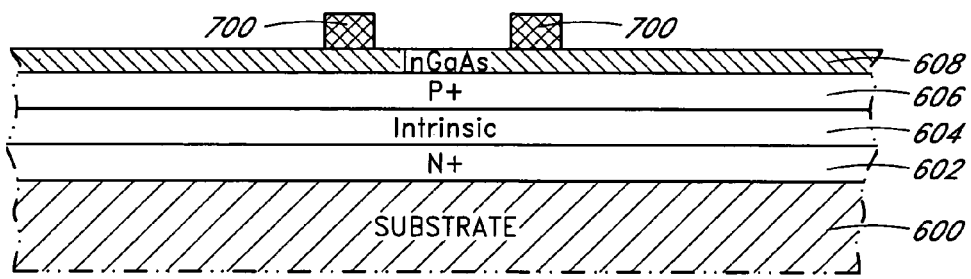
Figure 7B:
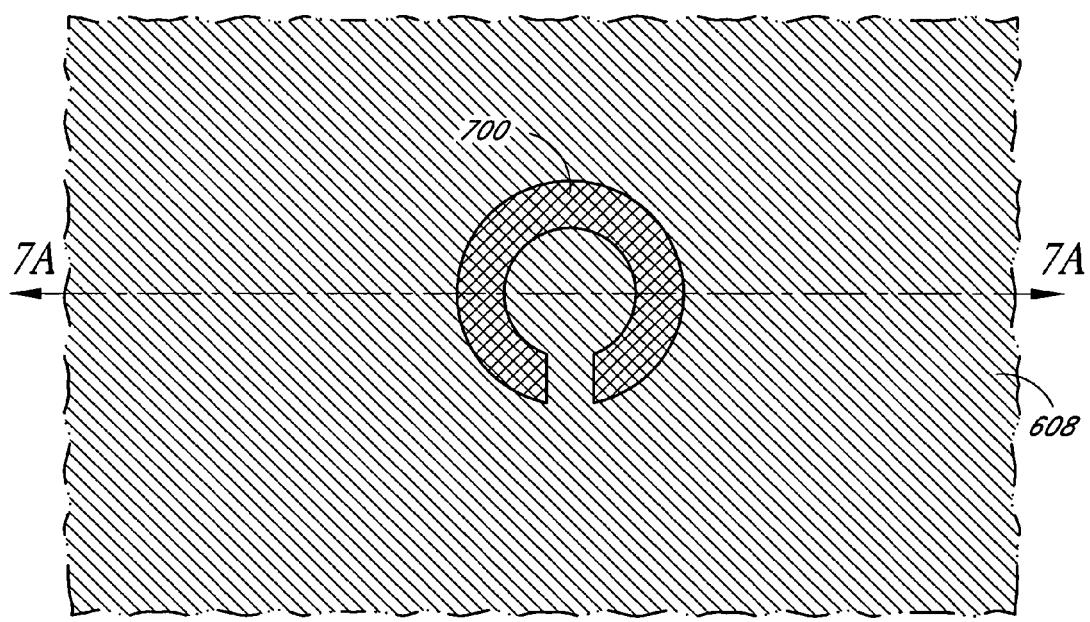

FIGS. 7A and 7B illustrate the wafer after formation of a metal contact 700 on top of the InGaAs layer 608. FIG. 7A shows a cross-sectional view. FIG. 7B shows a top (or plan) view. In one embodiment, metal is deposited for making an electrical contact to the P+ layer 606. A first mask is used to pattern a desired shape for the metal contact 700. For example, photoresist is applied after deposition of metal and is selectively exposed to light to mask off metal that is subsequently etched away, thereby leaving the metal contact 700 of the desired shape. Any photoresist remaining after etching is generally removed or stripped.

In one embodiment, the metal contact 700 is a circular strip with a small opening on one side. An interior area of the metal contact 700 helps to define an aperture for receiving a light signal. The periphery of the metal contact 700 helps to define the dimensions of the photodiode device. As discussed above, the InGaAs layer 608 is interposed between the metal contact 700 and the P+ layer 606 to facilitate a more ohmic contact.

Figure 8:
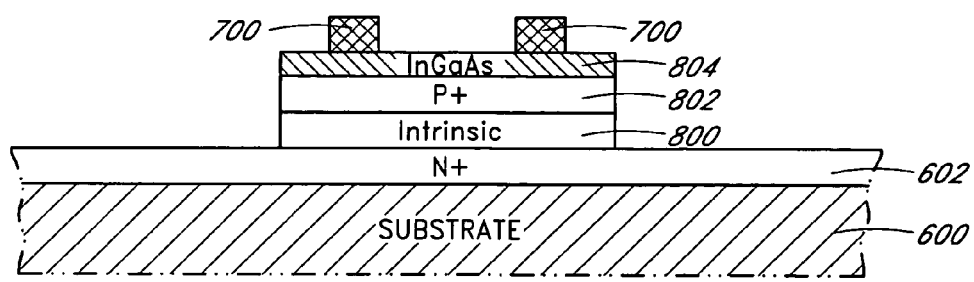

FIG. 8 illustrates the wafer after selective etching of the epitaxial layers to size a portion of the photodiode device. For example, a second mask is used to pattern the dimensions of photodiode device for the InGaAs layer 608, the P+ layer 606, and the intrinsic layer 604. In one embodiment, mesa etching helps to define an InGaAs (or contact) region 804, a P+ region 802, and an intrinsic region 800 that have substantially similar widths and lengths. The contact region 804, the P+ region 802, and the intrinsic region 800 are slightly larger than the periphery of the metal contact 700.

Figure 9:
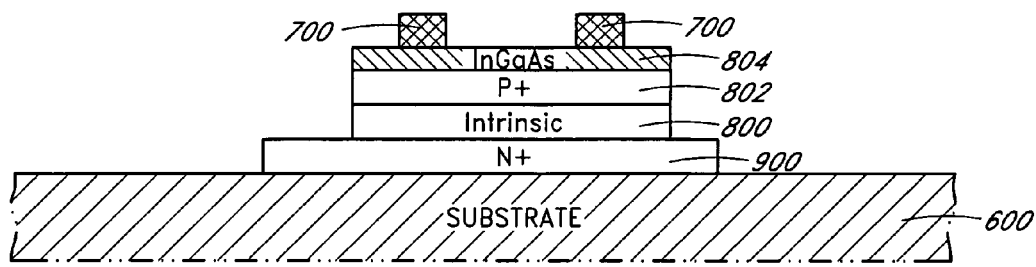

FIG. 9 illustrates the wafer after final etching of the epitaxial layers to realized desired dimensions for the photodiode device. For example, a third mask is used to pattern the N+ layer 602. In one embodiment, mesa etching helps to define an N+ region 900 that is sufficiently larger than the regions above it to expose an area for making a metal contact to the N+ region 900.

Figure 10:
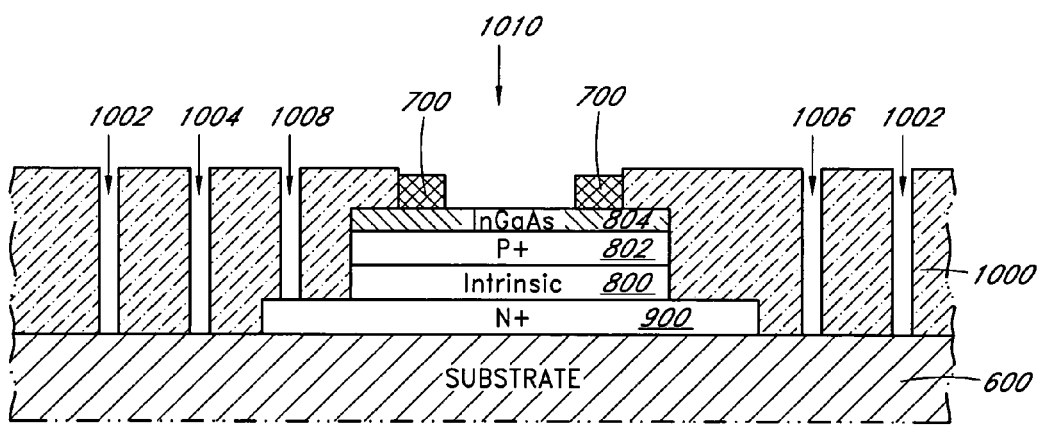

FIG. 10 illustrates the wafer after applying Benzocyclobutene (BCB) 1000 for planarization and selective etching of the BCB 1000 for optical aperture, via, street, and other desired openings. For example, a fourth mask is used to pattern an optical aperture 1010 defined by the metal contact 700. The fourth mask also patterns a first opening 1008 for making contact to the N+ region 900 and additional openings 1004, 1006 on either side of the photodiode device for making front side contacts in subsequent steps. The fourth mask further patterns a street 1002 around the photodiode device. The street 1002 defines a cut line for separating the photodiode die from other dies on the same wafer.

Figure 11:
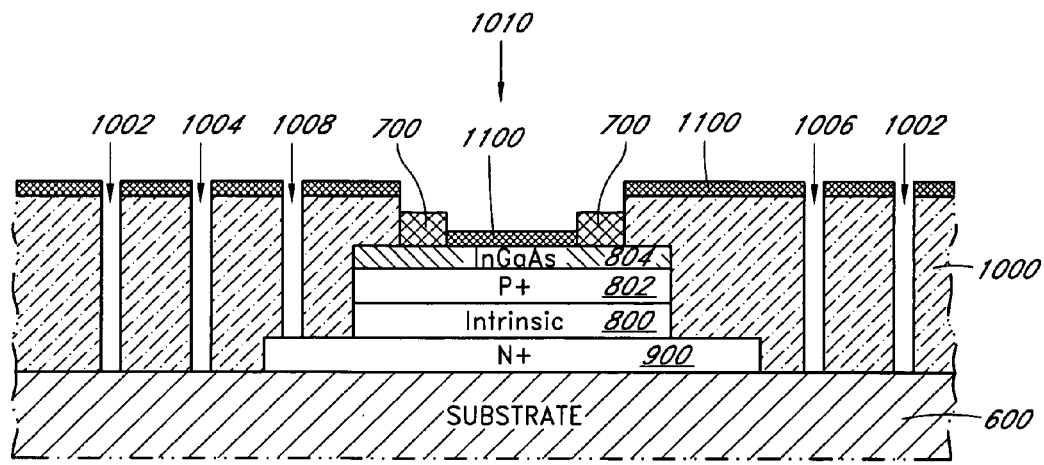

FIG. 11 illustrates the wafer after depositing silicon nitride (SiNx) 1100 and selective etching of the SiNx 1100 to expose via, street, and other desired openings. For example, the SiNx 1100 is deposited for passivation and anti-reflection. The SiNx 1100 intentionally covers the aperture 1010. A fifth mask is used to pattern the first opening 1008, the additional openings 1004, 1006, and the street 1002.

Figure 12:
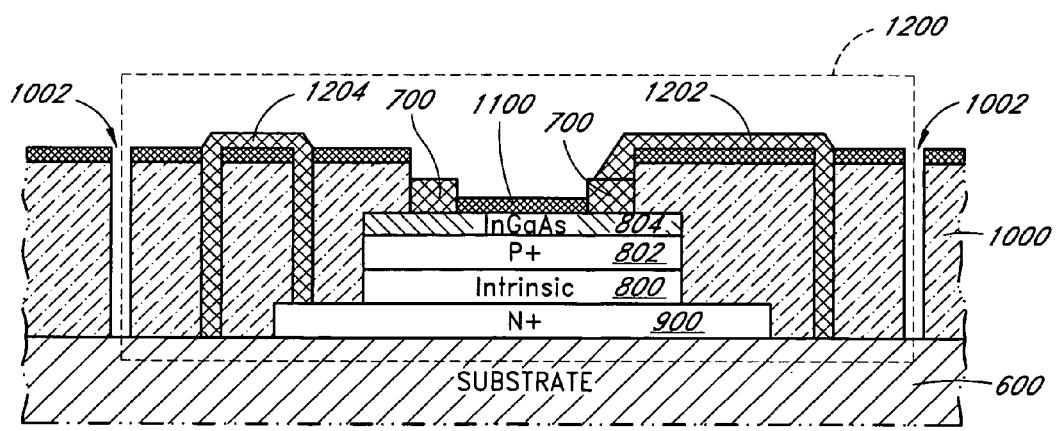

FIG. 12 illustrates the wafer after depositing metal to form front side contacts and connection of the front side contacts to the photodiode device. For example, metal is deposited, and a sixth mask helps to define a first conductive path 1204 between the N+ region 900 by way of the first opening 1008 and a first front side contact by way of the opening 1004. The sixth mask also defines a second conductive path 1202 between the P+ region 802 by way of the metal contact 700 and a second front side contact by way of the opening 1006. For convenience in illustration of subsequent processing steps, a dashed box is placed around the photodiode device 1200 completed on the front side of the wafer.

Figure 13:
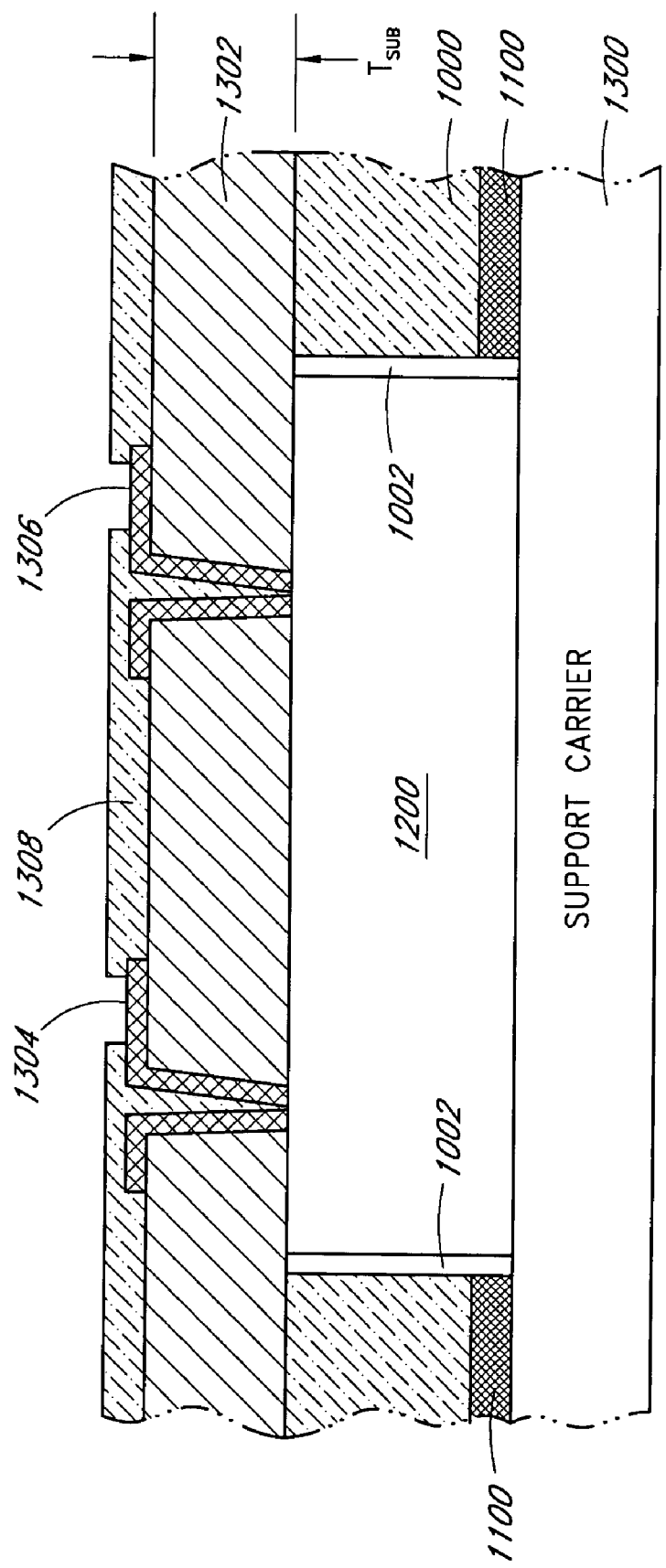

FIG. 13 illustrates the wafer after mounting on a support carrier 1300, thinning the wafer to a desired thickness ($T_{SUB}$), and formation of backside via holes. For example, the wafer is mounted upside down on the support carrier (e.g., a piece of sapphire) 1300 for backside processing. First, the semi-insulated substrate 600 is thinned by grinding or lapping plus polishing to form a substrate 1302 of the desired thickness ($T_{SUB}$).

For convenience of illustration, the relative dimensions for the wafer in the figures are not drawn to scale. For example, the typical depth (or height) of the photodiode device 1200 is, for example, approximately 2% of the depth of the thinned substrate 1302. The width of the wafer will vary with the number of devices desired to be integrated thereon. For convenience of illustration, a portion of the wafer corresponding to the formation of a single photodiode device is illustrated.

After the substrate 1302 is thinned and polished, backside via holes are etched through the substrate 1302. In one embodiment, a seventh mask along with infrared or dual imaging alignment help define the backside via holes. For example, the backside via holes are aligned with the respective front side contacts.

To facilitate electrical coupling of the front side contacts to the backside of the photodiode chip, a thin seed layer of metal with adhesion is deposited on the backside after the backside via holes are formed. A thick metal layer is then deposited by electroplating. Other methods of depositing the metal layer can also be used. Finally, an eighth mask helps to define conducting paths on the backside and backside contact pads 1304, 1306 which are electrically coupled to the front side contacts by the metal plated backside via holes.

In one embodiment, BCB 1308 is applied on the backside of the wafer for passivation. A ninth mask may be used for etching the BCB 1308 to expose the backside contact pads 1304, 1306, which are bumpable to a chip carrier or to an electronic chip. The wafer as illustrated on FIG. 13 can thereafter be demounted by separating the wafer from the support carrier 1300, and cut along the predefined street 1002 to separate the photodiode chip from other chips on the wafer. The photodiode chip is substantially similar to the photodiode chip shown in FIG. 14.

Figure 14:
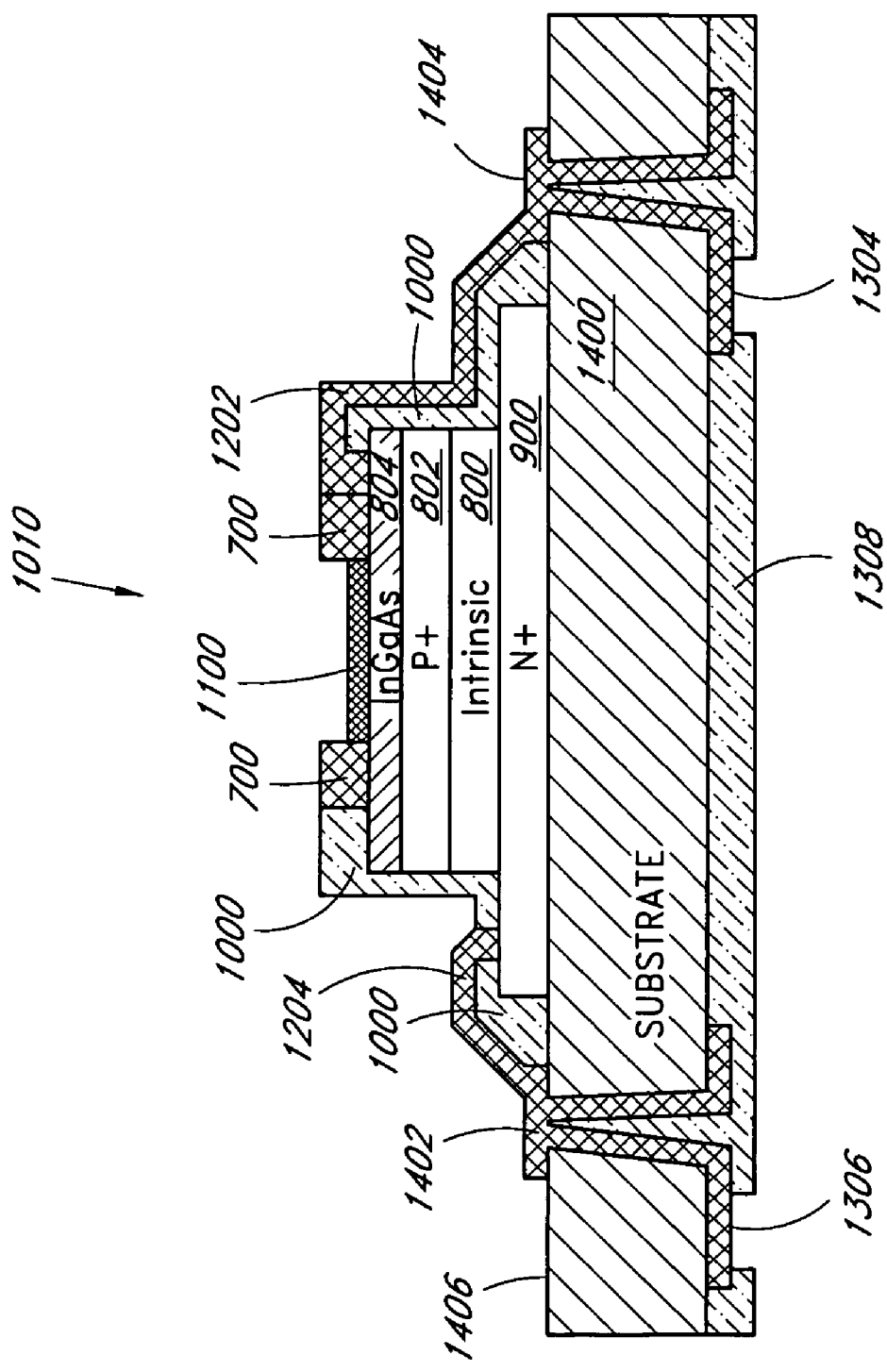
FIG. 14 is a detailed cross-sectional view of one embodiment of a PIN photodiode with backside contacts.

FIG. 14 is a detailed cross-sectional view of one embodiment of a PIN photodiode chip with backside contacts 1304, 1306. For example, a N+ region 900, an intrinsic region 800, a P+ region 802, and a contact region 804 are formed by epitaxial growth on a front side 1406 of the photodiode chip. A metal contact 700 is electrically coupled to the P+ region 802 with the aid of the interposed contact region 804. The metal contact 700 defines an optical aperture 1010 which is covered with SiNx 1100 for passivation and antireflection.

The metal contact 700 couples to a first front side contact 1404 by a first metal conducting path 1202. A second metal conducting path 1204 couples the N+ region 900 to a second front side contact 1402. Thus, the first front side contact 1404 is electrically coupled to an anode of the photodiode, and the second front side contact 1402 is electrically coupled to a cathode of the photodiode. In a front side illuminated photodiode application, the front side contacts 1402, 1404 can advantageously be used as test (or probe) pads to facilitate full testing (e.g., performance testing) of the photodiode chip at the wafer level. For example, the front side contacts 1402, 1404 can be connected to a tester using a probe card while a light source is delivered to the photodiode through fiber optic or bulk optic methods to facilitate full photonic testing at the wafer level.

The front side contacts 1402, 1404 are electrically coupled to respective backside contacts 1306, 1304 by vias through a substrate 1400 of the photodiode chip. The backside contacts 1306, 1304 advantageously allow the backside of the photodiode chip to be bumped to a chip carrier or to an electronic chip with the front side of the photodiode chip exposed to facilitate front illumination of the photodiode. In one embodiment, dielectric layers (e.g., BCB) 1000, 1308 are used on the front side as well as the backside to isolate different materials or to protect the photodiode chip from the environment.

Although the preferred embodiments of the present invention have shown, described, and pointed out the novel features of the invention as applied to those embodiments, it will be understood that various omissions, substitutions, and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. An optical receiver module comprising:
   a photodiode chip with a PIN photodiode formed on a front side of a semiconductor wafer and electrical contacts to the PIN photodiode formed on a backside of the semiconductor wafer, wherein the PIN photodiode is fabricated using InP, and an InGaAs layer is formed on a P+ layer for making an ohmic contact; and
   a transimpedance amplifier chip with electrical terminals coupled to the backside of the photodiode chip by solder bumps to form a chip-on-chip module.

2. The optical receiver module of claim 1, wherein the PIN photodiode is formed by epitaxial layers grown on the semiconductor wafer.

3. The apparatus of claim 1, wherein vias couple the electrical contacts on the backside of the semiconductor wafer to a cathode and an anode of the PIN photodiode on the front side of the semiconductor wafer.

4. An apparatus comprising:
   an optoelectronic device formed on a front side of a semiconductor wafer in an integrated circuit fabrication process, wherein the optoelectronic device is fabricated using InP, and an InGaAs layer is formed on a P+ layer for making an ohmic contact; and
   at least one electrical contact on a backside of the semiconductor wafer, wherein the electrical contact is electrically coupled to the optoelectronic device through a via in the semiconductor wafer.

5. The apparatus of claim 4, wherein the optoelectronic device interfaces an optical system with an electrical system, and the front side of the semiconductor wafer is proximal to the optical system.

6. The apparatus of claim 4, wherein the optoelectronic device has an aperture for communication with an optical system, and the aperture is proximal to the optical system.

7. The apparatus of claim 5, wherein the backside of the semiconductor wafer is proximal to the electrical system.

8. The apparatus of claim 4, further comprising a chip carrier, wherein the backside of the semiconductor wafer is mounted on the chip carrier to assemble a chip package.

9. The apparatus of claim 4, further comprising an electronic chip, wherein the backside of the semiconductor wafer is mounted on the electronic chip to assemble a chip-on-chip module.

10. The apparatus of claim 8, wherein the electrical contact on the backside of the semiconductor wafer is electrically connected to an electrical contact on the chip carrier using a solder bump.

11. The apparatus of claim 9, wherein the electrical contact on the back side of the semiconductor wafer is electrically connected to an electrical contact on the electronic chip using a solder bump.

12. The apparatus of claim 4, wherein the optoelectronic device is formed by epitaxial growth on the semiconductor wafer.

13. An apparatus comprising:
   an array of optoelectronic devices formed on a front side of a semiconductor wafer, wherein at least one of the optoelectronic devices is fabricated using InP, and an InGaAs layer is formed on a P+ layer for making an ohmic contact; and
   a corresponding array of electrical contacts on a backside of the semiconductor wafer, wherein the electrical contacts are electrically coupled to the corresponding optoelectronic devices by respective vias through the semiconductor wafer.

14. The apparatus of claim 13, wherein the optoelectronic devices are photo detectors.

15. The apparatus of claim 13, wherein the optoelectronic devices are light emitting devices.

16. An apparatus for sensing a light signal and for producing a corresponding electrical signal, the apparatus comprising:
   a photodiode formed on a front side of a semiconductor wafer in fabrication of an integrated circuit, wherein the photodiode is fabricated using InP, and an InGaAs layer is formed on a P+ layer for making an ohmic contact;
   a first contact on a back side of the semiconductor wafer, wherein the first contact is electrically coupled to an anode of the photodiode by a first via through the semiconductor wafer; and
   a second contact on the back side of the semiconductor wafer, wherein the second contact is electrically coupled to a cathode of the photodiode by a second via through the semiconductor wafer.

17. The apparatus of claim 16, wherein the semiconductor wafer is a Si, Ge, GaAs, or InP material.

18. The apparatus of claim 16, wherein the photodiode is a PIN photodiode, an avalanche photodiode, or a metal-semiconductor-metal Schottky photodiode.

19. The apparatus of claim 16, wherein the photodiode is used in an optical communication system to interface a fiber optic cable with an electronic receiver circuit, the front side of the semiconductor wafer is proximal to an output of the fiber optic cable for receiving the light signal, and the backside of the semiconductor wafer is proximal to an input of the electronic receiver circuit for providing the corresponding electrical signal.

20. The apparatus of claim 16, further comprising a chip carrier, and wherein the first contact and the second contact are electrically bumped to corresponding contacts on the chip carrier.

21. The apparatus of claim 16, further comprising an electronic receiver chip, wherein the backside of the semiconductor wafer is coupled to a front side of the electronic receiver chip to form a chip-on-chip stack, and wherein the photo detector is exposed on top of the chip-on-chip stack for receiving the light signal.

22. The apparatus of claim 21, wherein the first contact and the second contact on the backside of the semiconductor wafer are electrically bumped to corresponding contacts on the front side of the electronic receiver chip.

23. The apparatus of claim 21, wherein the electronic receiver chip is a transimpedance amplifier, and the anode and the cathode of the photodiode are coupled to respective inputs of the transimpedance amplifier by bumping the backside of the semiconductor wafer to the front side of the electronic receiver chip.

24. An apparatus for receiving an electrical signal and for producing a corresponding light signal, the apparatus comprising:

a laser diode formed on a front side of a semiconductor wafer, wherein the laser diode is fabricated using InP, and an InGaAs layer is formed on a P+ layer for making an ohmic contact; and contacts formed on a backside of the semiconductor wafer, wherein the contacts are electrically coupled to the laser diode by electrically conductive via holes through the semiconductor wafer.

25. The apparatus of claim 24, wherein the laser diode is a distributed-feedback laser or a vertical surface emitting laser.

* * * * *